US011445604B2

(12) United States Patent
Ku et al.

(10) Patent No.: US 11,445,604 B2
(45) Date of Patent: Sep. 13, 2022

(54) ELECTRONIC DEVICE FOR PROVIDING FEEDBACK CORRESPONDING TO INPUT FOR HOUSING

(71) Applicant: SAMSUNG ELECTRONICS CO., LTD., Suwon-si (KR)

(72) Inventors: Bonseok Ku, Suwon-si (KR); Junghan Kim, Suwon-si (KR); Kuyoung Choi, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 206 days.

(21) Appl. No.: 16/872,505

(22) Filed: May 12, 2020

(65) Prior Publication Data
US 2020/0375018 A1 Nov. 26, 2020

(30) Foreign Application Priority Data

May 23, 2019 (KR) .......................... 10-2019-0060869

(51) Int. Cl.
*H05K 1/02* (2006.01)
*H05K 1/14* (2006.01)
(Continued)

(52) U.S. Cl.
CPC .......... *H05K 1/028* (2013.01); *H04M 1/0277* (2013.01); *H05K 1/0283* (2013.01);
(Continued)

(58) Field of Classification Search
CPC .. G05D 1/0246; G05D 1/0272; G05D 1/0274; G05D 1/0225; G05D 1/0234;
(Continued)

(56) References Cited

U.S. PATENT DOCUMENTS 6,497,607 B1 * 12/2002 Hampton .................. A63H 3/28
446/337
7,364,489 B1 * 4/2008 Iaconis .................... A63H 3/46
446/376
(Continued)

FOREIGN PATENT DOCUMENTS

| CN | 103357173 | 10/2013 |
| JP | 2001-212785 | 8/2001 |
| JP | 2005-254454 | 9/2005 |
| JP | 2014-138966 | 7/2014 |

(Continued)

OTHER PUBLICATIONS

English Translation KR20110076426 (Year: 2011).*
International Search Report dated Jul. 31, 2020 in counterpart International Patent Application No. PCT/KR2020/005408.

*Primary Examiner* — Steven T Sawyer
(74) *Attorney, Agent, or Firm* — Nixon & Vanderhye P.C.

(57) ABSTRACT

An electronic device for providing feedback corresponding to an input for a housing may include a housing comprising a flexible material, a flexible printed circuit board (FPCB) positioned within the housing, at least one distance measurement sensor operatively coupled to the FPCB, and configured to transmit a signal to at least some area of the housing at given periods and further configured to receive a signal reflected by the some area, and at least one processor operatively coupled to the FPCB and the at least one distance measurement sensor. The at least one processor may be configured to control the electronic device to: receive data from the at least one distance measurement sensor, identify an external input for at least some area of the housing based on the received data, and provide feedback corresponding to the identified external input.

23 Claims, 12 Drawing Sheets

(51) Int. Cl.
*H05K 1/11* (2006.01)
*H04M 1/02* (2006.01)
*H05K 1/18* (2006.01)

(52) U.S. Cl.
CPC .............. *H05K 1/118* (2013.01); *H05K 1/147* (2013.01); *H05K 1/189* (2013.01); *H05K 2201/2009* (2013.01)

(58) Field of Classification Search
CPC .. G05D 1/0242; G05D 1/0251; G05D 1/0255; G05D 1/027; G05D 2201/0207; G06N 3/008; G16H 20/00; G16H 20/13; G16H 40/63; G16H 40/67; G16H 70/40; Y10S 901/01; Y10S 901/46; Y10S 901/47; H04N 7/142; H04N 7/185; B25J 5/007; B25J 9/08; B25J 13/086; B25J 11/005; B25J 9/0009; B25J 9/161; B25J 13/00; B25J 19/02; B25J 19/061; F16M 11/18; F16M 11/42; F16M 13/00; H05K 1/028; H05K 1/0283; H05K 1/118; H05K 1/147; H05K 1/189; H05K 2201/2009; H05K 2201/052; H05K 2201/10151; H04M 1/0277
See application file for complete search history.

(56) References Cited

U.S. PATENT DOCUMENTS

| | | | |
|---|---|---|---|
| 10,286,558 B1 * | 5/2019 | Asada | B25J 13/003 |
| 11,211,700 B1 * | 12/2021 | Mohan | B25J 13/006 |
| 2002/0116091 A1 | 8/2002 | Yamamoto | |
| 2009/0209170 A1 * | 8/2009 | Richter | A63H 3/28 |
| | | | 348/207.99 |
| 2011/0021108 A1 * | 1/2011 | Le | A63H 13/00 |
| | | | 446/298 |
| 2011/0067504 A1 | 3/2011 | Koyama et al. | |
| 2012/0240691 A1 | 9/2012 | Wettels et al. | |
| 2014/0015914 A1 * | 1/2014 | Delaunay | H04N 7/15 |
| | | | 348/14.02 |
| 2014/0188325 A1 * | 7/2014 | Johnson | G01S 17/08 |
| | | | 901/1 |
| 2014/0207279 A1 | 7/2014 | Miyauchi et al. | |
| 2017/0332868 A1 * | 11/2017 | Nam | A47L 9/04 |
| 2018/0360002 A1 * | 12/2018 | Planquette | A01K 31/04 |
| 2020/0319698 A1 * | 10/2020 | Mizuno | G06F 1/163 |

FOREIGN PATENT DOCUMENTS

| | | |
|---|---|---|
| KR | 10-2011-0076426 | 7/2011 |
| KR | 10-1094559 | 12/2011 |
| KR | 10-2017-0105298 | 9/2017 |
| WO | 2012/129410 | 9/2012 |

* cited by examiner

ELECTRONIC DEVICE FOR PROVIDING FEEDBACK CORRESPONDING TO INPUT FOR HOUSING

CROSS-REFERENCE TO RELATED APPLICATION

This application is based on and claims priority under 35 U.S.C. § 119 to Korean Patent Application No. 10-2019-0060869 filed on May 23, 2019, in the Korean Intellectual Property Office, the disclosure of which is incorporated by reference herein in its entirety.

BACKGROUND

Technical Field

The disclosure relates to an electronic device for providing feedback corresponding to an input for a housing.

Description of Related Art

As electronic devices, such as robots for industry and robots for daily use, are increasingly used, the electronic device may provide a user with various services.

For example, the electronic device may provide services, such as guide, education, advertising, and security, in addition to factory automation service in which a given task is performed in place of a worker.

A robot for daily use may provide various types of feedback in response to an input from an electronic device user. For example, the electronic device may receive a user's input through an interface (e.g., display, microphone or button) and provide the user with feedback (e.g., execution of a response or operation) for the received input.

If a surface of the housing of an electronic device (e.g., robot) is made of a rigid material, a user's input may be restricted. For example, the electronic device may receive a voice input from a user or a touch input for a fixed area and provide corresponding feedback.

On the other hand, if a surface of the housing of an electronic device is made of a flexible material, a sensor may show given performance because there is a variation in the mounting of the sensor. For example, if a surface of the housing of an electronic device is made of a flexible material, the electronic device may malfunction or may not provide results expected by a user because the electronic device does not clearly identify the user's input.

SUMMARY

Embodiments of the disclosure may provide an electronic device capable of receiving accurate and various inputs and providing various types of feedback to a user by configuring a surface of a housing using a flexible material and detecting a signal, input to the housing, using, for example, a distance measurement sensor.

According to an example aspect of the disclosure, an electronic device configured to provide feedback corresponding to an input for a housing may include: a housing comprising a flexible material, a flexible printed circuit board (FPCB) positioned within the housing, at least one distance measurement sensor operatively coupled to the FPCB and configured to transmit a signal to at least some area of the housing at given periods and further configured to receive a signal reflected by the some area, and at least one processor operatively coupled to the FPCB and the at least one distance measurement sensor. The at least one processor may be configured to control the electronic device to: receive data from the at least one distance measurement sensor, identify an external input for at least some area of the housing based on the received data, and provide feedback corresponding to the identified external input.

According to another example aspect of the disclosure, an electronic device may include a head unit comprising a head of the electronic device, wherein a display is positioned in at least some of the head unit, a body unit comprising a body of the electronic device and including a housing comprising a flexible material, a body shaft operatively coupled to the head unit, and a printed circuit board (PCB), and a driving unit comprising drive circuitry operatively coupled to the body unit and configured to provide a movement of the electronic device. The body unit may include a flexible printed circuit board (FPCB) positioned on an external surface of the body shaft, a distance measurement sensor operatively coupled to the FPCB and configured to transmit a signal to at least some area of the housing at given periods and further configured to detect a signal reflected and received from the at least some area where an external input occurs based on the external input occurring in the at least some area, and at least one processor configured to control the electronic device to provide feedback corresponding to the external input transmitted through the distance measurement sensor.

BRIEF DESCRIPTION OF THE DRAWINGS

The above and other aspects, features and advantages of certain embodiments of the present disclosure will be more apparent from the following detailed description, taken in conjunction with the accompanying drawings, in which.

DETAILED DESCRIPTION

Hereinafter, various example embodiments of the disclosure will be described in greater detail with reference to accompanying drawings.

Figure 1:
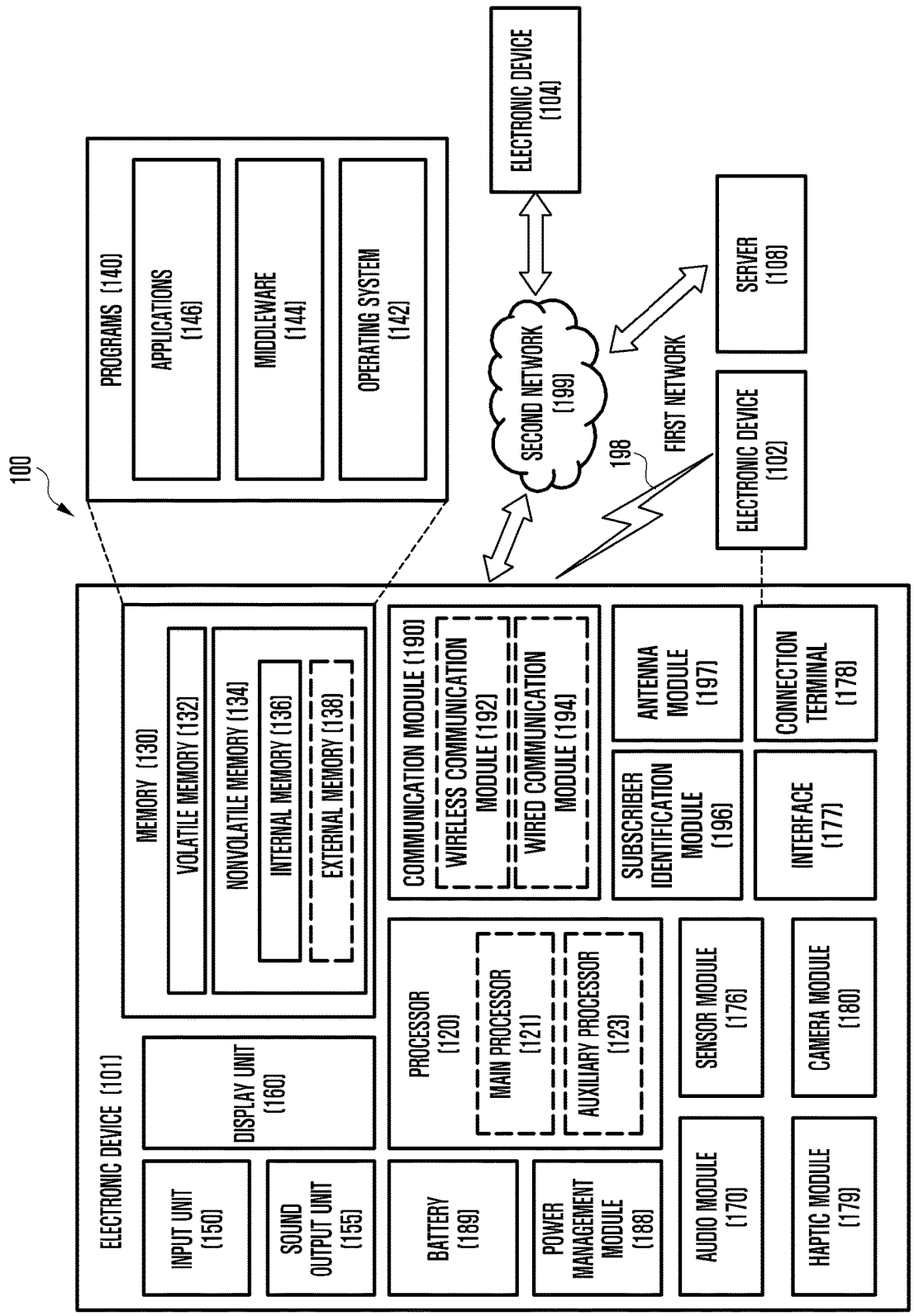
FIG. 1 is a block diagram illustrating an example electronic device in a network environment according to various embodiments of the disclosure.

FIG. 1 is a block diagram illustrating an electronic device 101 in a network environment 100 according to certain embodiments.

Referring to FIG. 1, the electronic device 101 in the network environment 100 may communicate with an electronic device 102 via a first network 198 (e.g., a short-range wireless communication network), or an electronic device 104 or a server 108 via a second network 199 (e.g., a long-range wireless communication network). According to an embodiment, the electronic device 101 may communicate with the electronic device 104 via the server 108. According to an embodiment, the electronic device 101 may include a processor 120, memory 130, an input device 150, a sound output device 155, a display device 160, an audio module 170, a sensor module 176, an interface 177, a haptic module 179, a camera module 180, a power management module 188, a battery 189, a communication module 190, a subscriber identification module (SIM) 196, or an antenna module 197. In some embodiments, at least one (e.g., the display device 160 or the camera module 180) of the components may be omitted from the electronic device 101, or one or more other components may be added in the electronic device 101. In some embodiments, some of the components may be implemented as single integrated circuitry. For example, the sensor module 176 (e.g., a fingerprint sensor, an iris sensor, or an illuminance sensor) may be implemented as embedded in the display device 160 (e.g., a display).

The processor 120 may execute, for example, software (e.g., a program 140) to control at least one other component (e.g., a hardware or software component) of the electronic device 101 coupled with the processor 120, and may perform certain data processing or computation. According to an embodiment, as at least part of the data processing or computation, the processor 120 may load a command or data received from another component (e.g., the sensor module 176 or the communication module 190) in volatile memory 132, process the command or the data stored in the volatile memory 132, and store resulting data in non-volatile memory 134. According to an embodiment, the processor 120 may include a main processor 121 (e.g., a central processing unit (CPU) or an application processor (AP)), and an auxiliary processor 123 (e.g., a graphics processing unit (GPU), an image signal processor (ISP), a sensor hub processor, or a communication processor (CP)) that is operable independently from, or in conjunction with, the main processor 121. Additionally or alternatively, the auxiliary processor 123 may be adapted to consume less power than the main processor 121, or to be specific to a specified function. The auxiliary processor 123 may be implemented as separate from, or as part of the main processor 121.

The auxiliary processor 123 may control at least some of functions or states related to at least one component (e.g., the display device 160, the sensor module 176, or the communication module 190) among the components of the electronic device 101, instead of the main processor 121 while the main processor 121 is in an inactive (e.g., sleep) state, or together with the main processor 121 while the main processor 121 is in an active state (e.g., executing an application). According to an embodiment, the auxiliary processor 123 (e.g., an image signal processor or a communication processor) may be implemented as part of another component (e.g., the camera module 180 or the communication module 190) functionally related to the auxiliary processor 123.

The memory 130 may store certain data used by at least one component (e.g., the processor 120 or the sensor module 176) of the electronic device 101. The certain data may include, for example, software (e.g., the program 140) and input data or output data for a command related thereto. The memory 130 may include the volatile memory 132 or the non-volatile memory 134.

The program 140 may be stored in the memory 130 as software, and may include, for example, an operating system (OS) 142, middleware 144, or an application 146.

The input device 150 may receive a command or data to be used by other component (e.g., the processor 120) of the electronic device 101, from the outside (e.g., a user) of the electronic device 101. The input device 150 may include, for example, a microphone, a mouse, or a keyboard.

The sound output device 155 may output sound signals to the outside of the electronic device 101. The sound output device 155 may include, for example, a speaker or a receiver. The speaker may be used for general purposes, such as playing multimedia or playing record, and the receiver may be used for an incoming calls. According to an embodiment, the receiver may be implemented as separate from, or as part of the speaker.

The display device 160 may visually provide information to the outside (e.g., a user) of the electronic device 101. The display device 160 may include, for example, a display, a hologram device, or a projector and control circuitry to control a corresponding one of the display, hologram device, and projector. According to an embodiment, the display device 160 may include touch circuitry adapted to detect a touch, or sensor circuitry (e.g., a pressure sensor) adapted to measure the intensity of force incurred by the touch.

The audio module 170 may convert a sound into an electrical signal and vice versa. According to an embodiment, the audio module 170 may obtain the sound via the input device 150, or output the sound via the sound output device 155 or a headphone of an external electronic device (e.g., an electronic device 102) directly (e.g., wiredly) or wirelessly coupled with the electronic device 101.

The sensor module 176 may detect an operational state (e.g., power or temperature) of the electronic device 101 or an environmental state (e.g., a state of a user) external to the electronic device 101, and then generate an electrical signal or data value corresponding to the detected state. According to an embodiment, the sensor module 176 may include, for example, a gesture sensor, a gyro sensor, an atmospheric pressure sensor, a magnetic sensor, an acceleration sensor, a grip sensor, a proximity sensor, a color sensor, an infrared (IR) sensor, a biometric sensor, a temperature sensor, a humidity sensor, or an illuminance sensor.

The interface 177 may support one or more specified protocols to be used for the electronic device 101 to be coupled with the external electronic device (e.g., the electronic device 102) directly (e.g., wiredly) or wirelessly. According to an embodiment, the interface 177 may include, for example, a high definition multimedia interface (HDMI), a universal serial bus (USB) interface, a secure digital (SD) card interface, or an audio interface.

A connecting terminal 178 may include a connector via which the electronic device 101 may be physically connected with the external electronic device (e.g., the electronic device 102). According to an embodiment, the connecting terminal 178 may include, for example, a HDMI connector, a USB connector, a SD card connector, or an audio connector (e.g., a headphone connector).

The haptic module 179 may convert an electrical signal into a mechanical stimulus (e.g., a vibration or a movement) or electrical stimulus which may be recognized by a user via his tactile sensation or kinesthetic sensation. According to an embodiment, the haptic module 179 may include, for example, a motor, a piezoelectric element, or an electric stimulator.

The camera module 180 may capture a still image or moving images. According to an embodiment, the camera module 180 may include one or more lenses, image sensors, image signal processors, or flashes.

The power management module 188 may manage power supplied to the electronic device 101. According to an embodiment, the power management module 188 may be implemented as at least part of, for example, a power management integrated circuit (PMIC).

The battery 189 may supply power to at least one component of the electronic device 101. According to an embodiment, the battery 189 may include, for example, a primary cell which is not rechargeable, a secondary cell which is rechargeable, or a fuel cell.

The communication module 190 may support establishing a direct (e.g., wired) communication channel or a wireless communication channel between the electronic device 101 and the external electronic device (e.g., the electronic device 102, the electronic device 104, or the server 108) and performing communication via the established communication channel. The communication module 190 may include one or more communication processors that are operable independently from the processor 120 (e.g., the application processor (AP)) and supports a direct (e.g., wired) communication or a wireless communication. According to an embodiment, the communication module 190 may include a wireless communication module 192 (e.g., a cellular communication module, a short-range wireless communication module, or a global navigation satellite system (GNSS) communication module) or a wired communication module 194 (e.g., a local area network (LAN) communication module or a power line communication (PLC) module). A corresponding one of these communication modules may communicate with the external electronic device via the first network 198 (e.g., a short-range communication network, such as Bluetooth™, wireless-fidelity (Wi-Fi) direct, or infrared data association (IrDA)) or the second network 199 (e.g., a long-range communication network, such as a cellular network, the Internet, or a computer network (e.g., LAN or wide area network (WAN)). These certain types of communication modules may be implemented as a single component (e.g., a single chip), or may be implemented as multi components (e.g., multi chips) separate from each other. The wireless communication module 192 may identify and authenticate the electronic device 101 in a communication network, such as the first network 198 or the second network 199, using subscriber information (e.g., international mobile subscriber identity (IMSI)) stored in the subscriber identification module 196.

The antenna module 197 may transmit/receive a signal or power to/from an external entity (e.g., an external electronic device). According to some embodiments, the antenna module 197 may be formed of a conductor or a conductive pattern and may further include any other component (e.g., RFIC). According to an embodiment, the antenna module 197 may include one or more antennas, which may be selected to be suitable for a communication scheme used in a specific communication network, such as the first network 198 or the second network 199 by, for example, the communication module 190. Through the selected at least one antenna, a signal or power may be transmitted or received between the communication module 190 and the external electronic device.

At least some of the above-described components may be coupled mutually and communicate signals (e.g., commands or data) therebetween via an inter-peripheral communication scheme (e.g., a bus, general purpose input and output (GPIO), serial peripheral interface (SPI), or mobile industry processor interface (MIPI)).

According to an embodiment, commands or data may be transmitted or received between the electronic device 101 and the external electronic device 104 via the server 108 coupled with the second network 199. Each of the electronic devices 102 and 104 may be a device of a same type as, or a different type, from the electronic device 101. According to an embodiment, all or some of operations to be executed at the electronic device 101 may be executed at one or more of the external electronic devices 102, 104, or 108. For example, if the electronic device 101 should perform a function or a service automatically, or in response to a request from a user or another device, the electronic device 101, instead of, or in addition to, executing the function or the service, may request the one or more external electronic devices to perform at least part of the function or the service. The one or more external electronic devices receiving the request may perform the at least part of the function or the service requested, or an additional function or an additional service related to the request, and transfer an outcome of the performing to the electronic device 101. The electronic device 101 may provide the outcome, with or without further processing of the outcome, as at least part of a reply to the request. To that end, a cloud computing, distributed computing, or client-server computing technology may be used, for example.

The electronic device according to certain embodiments may be one of certain types of electronic devices. The electronic devices may include, for example, a portable communication device (e.g., a smart phone), a computer device, a portable multimedia device, a portable medical device, a camera, a wearable device, or a home appliance. According to an embodiment of the disclosure, the electronic devices are not limited to those described above.

It should be appreciated that certain embodiments of the present disclosure and the terms used therein are not intended to limit the technological features set forth herein to particular embodiments and include certain changes, equivalents, or replacements for a corresponding embodiment. With regard to the description of the drawings, similar reference numerals may be used to refer to similar or related elements. It is to be understood that a singular form of a noun corresponding to an item may include one or more of the things, unless the relevant context clearly indicates otherwise. As used herein, each of such phrases as "A or B," "at least one of A and B," "at least one of A or B," "A, B, or C," "at least one of A, B, and C," and "at least one of A, B, or C," may include all possible combinations of the items enumerated together in a corresponding one of the phrases. As used herein, such terms as "1st" and "2nd," or "first" and "second" may be used to simply distinguish a corresponding component from another, and does not limit the components in other aspect (e.g., importance or order). It is to be understood that if an element (e.g., a first element) is referred to, with or without the term "operatively" or "communicatively", as "coupled with," "coupled to," "connected with," or "connected to" another element (e.g., a second element), it means that the element may be coupled with the other element directly (e.g., wiredly), wirelessly, or via a third element.

As used herein, the term "module" may include a unit implemented in hardware, software, or firmware, and may interchangeably be used with other terms, for example, "logic," "logic block," "part," or "circuitry". A module may be a single integral component, or a minimum unit or part thereof, adapted to perform one or more functions. For example, according to an embodiment, the module may be implemented in a form of an application-specific integrated circuit (ASIC).

Certain embodiments as set forth herein may be implemented as software (e.g., the program 140) including one or more instructions that are stored in a storage medium (e.g., internal memory 136 or external memory 138) that is readable by a machine (e.g., the electronic device 101). For example, a processor (e.g., the processor 120) of the machine (e.g., the electronic device 101) may invoke at least one of the one or more instructions stored in the storage medium, and execute it, with or without using one or more other components under the control of the processor. This allows the machine to be operated to perform at least one function according to the at least one instruction invoked. The one or more instructions may include a code generated by a complier or a code executable by an interpreter. The machine-readable storage medium may be provided in the form of a non-transitory storage medium. Wherein, the term "non-transitory" simply means that the storage medium is a tangible device, and does not include a signal (e.g., an electromagnetic wave), but this term does not differentiate between where data is semi-permanently stored in the storage medium and where the data is temporarily stored in the storage medium.

According to an embodiment, a method according to certain embodiments of the disclosure may be included and provided in a computer program product. The computer program product may be traded as a product between a seller and a buyer. The computer program product may be distributed in the form of a machine-readable storage medium (e.g., compact disc read only memory (CD-ROM)), or be distributed (e.g., downloaded or uploaded) online via an application store (e.g., Play Store™), or between two user devices (e.g., smart phones) directly. If distributed online, at least part of the computer program product may be temporarily generated or at least temporarily stored in the machine-readable storage medium, such as memory of the manufacturer's server, a server of the application store, or a relay server.

According to certain embodiments, each component (e.g., a module or a program) of the above-described components may include a single entity or multiple entities. According to certain embodiments, one or more of the above-described components may be omitted, or one or more other components may be added. Alternatively or additionally, a plurality of components (e.g., modules or programs) may be integrated into a single component. In such a case, according to certain embodiments, the integrated component may still perform one or more functions of each of the plurality of components in the same or similar manner as they are performed by a corresponding one of the plurality of components before the integration. According to certain embodiments, operations performed by the module, the program, or another component may be carried out sequentially, in parallel, repeatedly, or heuristically, or one or more of the operations may be executed in a different order or omitted, or one or more other operations may be added.

Figure 2:
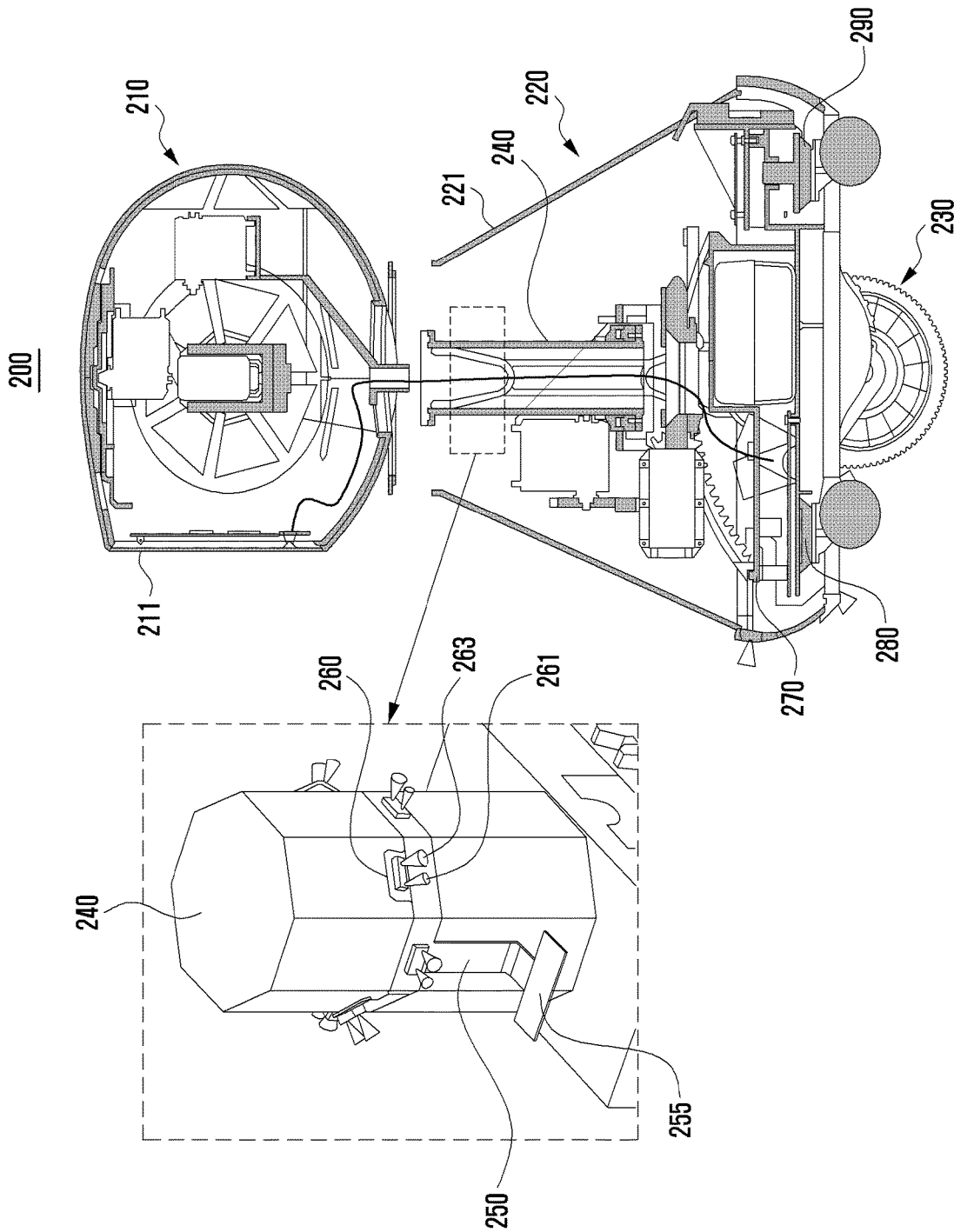
FIG. 2 is a diagram illustrating an example configuration of an example electronic device according to various embodiments of the disclosure.

FIG. 2 is a diagram illustrating an example configuration of an electronic device according to various embodiments of the disclosure.

Referring to FIG. 2, the electronic device 200 according to various embodiments of the disclosure may include a head unit (e.g., including a head of the electronic device) 210, a body unit (e.g., including a body of the electronic device) 220 and a driving unit (e.g., including driving circuitry (e.g., a motor and associated components)) 230.

According to various embodiments, the electronic device 200 may include the electronic device 101 in FIG. 1. The electronic device 200 may include a robot. The electronic device 200 (e.g., robot) may include a standalone type in which the head unit 210, the body unit 220, and the driving unit 230 are configured as a single housing and which is not movable and a docking station type in which the electronic device having a portable electronic device (e.g., smartphone or tablet PC) held therein can perform the function of the head unit 210. The electronic device 200 may include a fixed type and a movable type depending on whether it is movable. If the type of the electronic device 200 is the movable type, the type may include a wheel type, a caterpillar type, a leg movement (e.g., 2 legs or four legs) type and a drone type.

According to an example embodiment, the head unit 210 may form the head of the electronic device 200. The head unit 210 may include a display 211 (e.g., the display device 160 in FIG. 1) in at least some (e.g., front) of the head unit. The display 211 may display a user interface provided by the electronic device 200.

According to an example embodiment, the body unit 220 may form the body of the electronic device 200. The body unit 220 may include a housing 221, a body shaft 240, a printed circuit board (PCB) 270, a sound output unit (e.g., including sound output circuitry) 280 (e.g., the sound output device 155 in FIG. 1) and/or a vibration output unit (e.g., including a vibration motor) 290 (e.g., the haptic module 179 in FIG. 1).

According to various embodiments, a part of the housing 221 may include a flexible material having elasticity. The flexible material may include silicon rubber or urethane sponge, for example, and without limitation.

According to various embodiments, the body shaft 240 may form the shaft (e.g., pole) of the body unit 220. A flexible PCB (FPCB) 250 may be positioned on an external surface of the body shaft 240. A connector 255 may be positioned at one end of the FPCB 250. The FPCB 250 may be coupled to at least one distance measurement sensor 260 (e.g., the sensor module 176 in FIG. 1) positioned to surround the body shaft at intervals on the outside of the body shaft. The distance measurement sensor 260 may include a light-emitting unit (e.g., including light emitting circuitry) 261 and a light-receiving unit (e.g., including light receiving circuitry) 263.

According to various embodiments, the PCB 270 may be coupled to the connector 255 positioned at one end of the FPCB 250. The PCB 270 may include at least one processor (e.g., including processing circuitry, e.g., the first processor 330 and the second processor 340 in FIG. 3) related to the driving of the electronic device 200, and a memory (e.g., the memory 320 in FIG. 3). The PCB 270 may be operatively coupled to the display 211. The PCB 270 may be operatively coupled to the sound output unit 280 and the vibration output unit 290. A 6-axis sensor (e.g., 6-axis sensor 310 in FIG. 3) may be mounted on the PCB 270.

According to various embodiments, the sound output unit 280 may include various sound output circuitry and be positioned on a first side under the body unit 220. The sound output unit 280 may output a sound output by the electronic device 200.

According to various embodiments, the vibration output unit 290 may include various vibration output circuitry including, for example, a vibration motor, and be positioned on a second side under the body unit 220. The first side and the second side may be spaced apart from each other at an interval.

According to an example embodiment, the driving unit 230 may include various driving circuitry and components and support a movement of the electronic device 200. The driving unit 230 may include a wheel, for example and without limitation.

The electronic device 200 according to various embodiments of the disclosure includes the head unit 210 which includes the head of the electronic device 200 and in at least some of which the display 211 has been positioned; the body unit 220 which includes the body of the electronic device 200 and includes the housing 221 comprising a flexible material, the body shaft 240 operatively coupled to the head unit 210, and the PCB 270; and the driving unit 230 operatively coupled to the body unit 220, for providing a movement of the electronic device 200. The body unit 220 may include the FPCB 250 positioned on an external surface of the body shaft 240, the distance measurement sensor 260 operatively coupled to the FPCB 250, for transmitting a signal to at least some area of the housing 221 at given periods and detecting a signal reflected and received from the area where an external input has occurred when the external input occurs in the at least some area, and at least one processor 330 and 340 configured to provide feedback corresponding to the external input transmitted through the distance measurement sensor 260.

According to an example embodiment, a plurality of the distance measurement sensors 260 may be disposed on the FPCB 250 at given intervals to detect an external input occurring in at least some area of the housing 221. The number of distance measurement sensors 260 may be adjusted based, for example, on the field of view (FoV) of the distance measurement sensor.

According to an example embodiment, if the external surface of the housing 221 is configured as a curve, the distance measurement sensor 260 may be positioned on the FPCB 250 so that the transmission direction of a signal is tilted toward the top or bottom of the housing 221.

According to an example embodiment, the electronic device 200 may further include the 6-axis sensor 310 (see, e.g., FIG. 3) operatively coupled to at least one processor (e.g., the second processor 340). The at least one processor (e.g., the second processor 340) may be configured to output, for example, and without limitation, feedback providing notification that the electronic device 200 is in an abnormal state if it is determined that the electronic device 200 is tilted at a given angle or more or an external input continues to be maintained for a given time using the 6-axis sensor 310.

According to an example embodiment, the electronic device 200 may further include the sound output unit 280 or the vibration output unit 290 for providing feedback corresponding to an external input detected using the distance measurement sensor 260.

Figure 3:
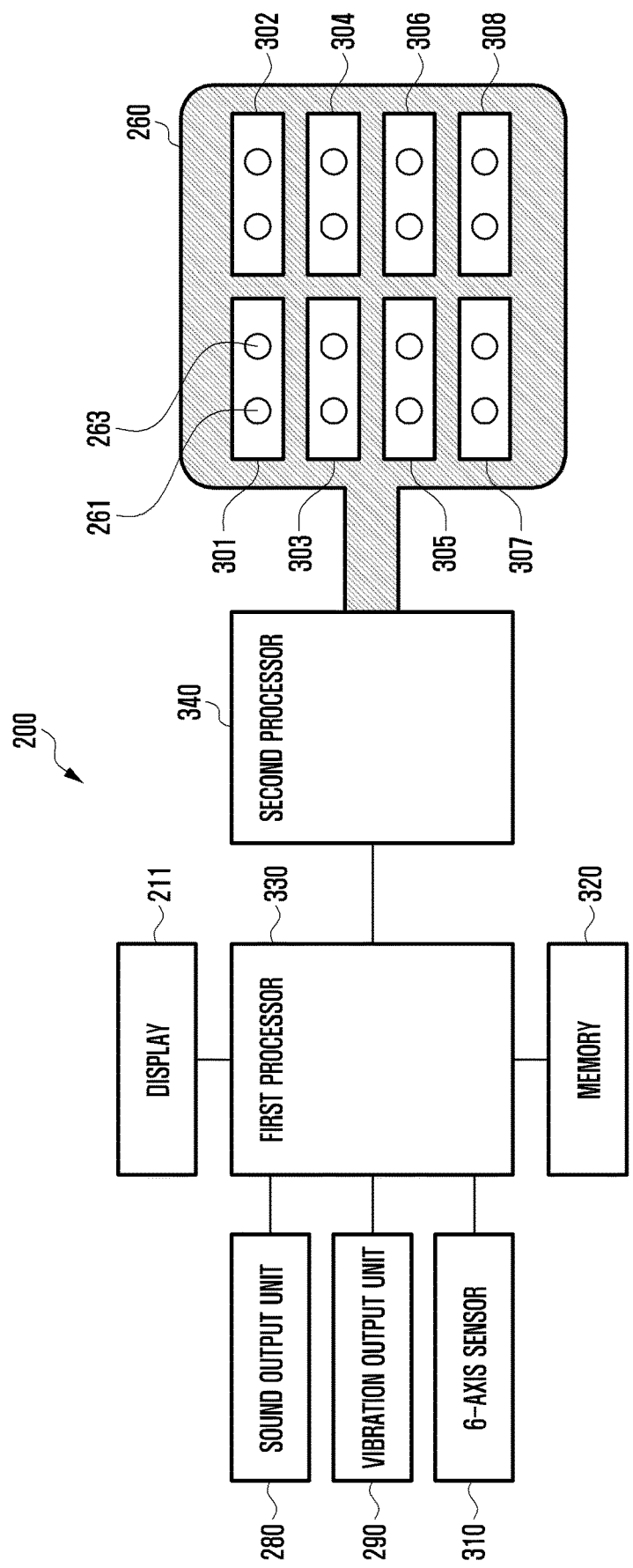
FIG. 3 is a block diagram illustrating an example configuration of an example electronic device according to various embodiments of the disclosure.

FIG. 3 is a block diagram illustrating an example configuration of an example electronic device according to various embodiments of the disclosure.

Referring to FIG. 3, the electronic device 200 according to various embodiments of the disclosure may include a display 211, a distance measurement sensor (e.g., including distance measurement circuitry) 260, a sound output unit (e.g., including sound output circuitry) 280, a vibration output unit (e.g., including vibration output circuitry) 290, a 6-axis sensor 310, a memory 320, a first processor (e.g., including processing circuitry) 330 and/or a second processor (e.g., including processing circuitry) 340.

According to various embodiments, the electronic device 200 may include the electronic device 101 in FIG. 1. The display 211 may include the display device 160 in FIG. 1. The distance measurement sensor 260 or the 6-axis sensor 310 may include the sensor module 176 in FIG. 1. The sound output unit 280 may include the sound output device 155 or the audio module 170 in FIG. 1. The vibration output unit 290 may include the haptic module 179 in FIG. 1. The first processor 330 (e.g., the main processor 121 in FIG. 1) and the second processor 340 (e.g., the auxiliary processor 123 in FIG. 1) may include the processor 120 in FIG. 1. The sound output unit 280, the vibration output unit 290, the 6-axis sensor 310, the memory 320, the first processor 330 and/or the second processor 340 may be mounted on the PCB 270 illustrated in FIG. 2 or may be operatively coupled to the PCB 270.

According to an example embodiment, the display 211 may display various user interfaces (UI) in response to an input signal for the housing 221, which may be detected using the distance measurement sensor 260.

According to various embodiments, the display 211 may perform an input function and a display function. To this end, the display 211 may include a touch panel. The display 211 may be configured, for example, and without limitation, as any one of a liquid crystal display (LCD), organic light emitting diodes (OLEDs), active matrix organic light emitting diodes (AMOLEDs), a flexible display, a transparent display, or the like. The display 211 may visually provide a user with a menu, input data, function setting information or various types of other information of the electronic device 200.

According to an example embodiment, when a user presses at least some area (e.g., surface) of the housing 221 of the electronic device 200, at least some of the housing 221 in which the pressing has occurred may be deformed. The distance measurement sensor 260 may detect a distance difference for the deformed area (e.g., surface). The distance measurement sensor 260 may include, for example, and without limitation, at least one of a proximity sensor, a time of flight (TOF) sensor, a position sensing device (PSD) sensor, or the like.

According to various embodiments, the distance measurement sensor 260 may be configured with a plurality of sensors (e.g., sensors 301, 302, 303, 304, 305, 306, 307 and 308 which may be referred to hereinafter as first sensor 301 to eighth sensor 308). Each of the plurality of sensors (e.g., the first sensor 301 to the eighth sensor 308) may include a light-emitting unit (e.g., including light emitting circuitry) 261 and a light-receiving unit (e.g., including light receiving circuitry) 263.

The distance measurement sensor 260 may transmit a given signal for distance measurement to at least some area (e.g., surface) of the housing 221 at given periods using, for example, the light-emitting unit 261. When an input (e.g., pressing) occurs in at least some area (e.g., surface) of the housing 221, the distance measurement sensor 260 may detect a given signal reflected and received from at least some area of the housing 221 in which the input occurs using, for example, the light-receiving unit 263. The signal may include, for example, and without limitation, light, infrared rays, an ultrasonic signal, or the like. The distance measurement sensor 260 may output a signal (e.g., light) using the light-emitting unit 261, and may measure the distance from a surface of the housing 221 in which an input (e.g., pressing) has occurred using the time of a signal taken to be reflected and received from the surface of the housing 221.

According to various embodiments, the first sensor 301 to the eighth sensor 308 corresponding to the distance measurement sensor 260 may be positioned on the FPCB 250, positioned on the external surface of the body shaft 240 illustrated in FIG. 2, at given intervals. The first sensor 301 to the eighth sensor 308 may be spaced apart from each other at given intervals so that they can cover signals, received through the housing 221 of the electronic device 200, in all the front directions (e.g., xyz axis) of 360°, and may be positioned on the FPCB 250. The number of first sensor 301 to eighth sensor 308 included in the distance measurement sensor 260 and the location of each sensor may be adjusted based on the direction and range of a field of view (FoV) which may be covered by each sensor.

According to various embodiments, the distance measurement sensor 260 may collect signals received through a surface of the housing 221 at intervals of about 30 ms, for example. The distance measurement sensor 260 may detect an input signal for a distance of about 2 mm to about 1 m, for example. The distance measurement sensor 260 may measure a surface of the housing 221 in about 1 mm unit. If the distance measurement sensor 260 may be configured with a plurality of sensors (e.g., first sensor 301 to eighth sensor 308), it may collect signals received through a surface of the housing 221 at intervals of about 30 ms, for example, for each sensor. The collected input signal data may be transmitted to the first processor 330 or the second processor 340 at intervals of about 100 ms or about 200 ms.

According to an example embodiment, the sound output unit 280 may include various sound output circuitry and output various sounds in response to an input signal for the housing 221, which is detected using the distance measurement sensor 260. The sound output unit 280 may include a speaker for outputting various sounds stored in the memory 320.

According to an example embodiment, the vibration output unit 290 may include various vibration output circuitry and output various vibrations in response to an input signal for the housing 221, which is detected using the distance measurement sensor 260. The vibration output unit 290 may include a haptic element capable of providing various vibrations to the user of the electronic device 200.

According to an example embodiment, the 6-axis sensor 310 may recognize that the electronic device 200 is tilted or falls at about 45° or more. The 6-axis sensor 310 may include, for example, and without limitation, an acceleration sensor and a gyro sensor, or the like.

According to various embodiments, if a value of the 6-axis sensor 310 is tilted at a value that is not horizontal or about 45° or more and an input signal (e.g., touch signal and pressing signal) for at least one sensor (e.g., the first sensor 301 to the eighth sensor 308) of the distance measurement sensor 260 continues to be maintained for a predetermined time (e.g., for about 5 seconds or more) without a distance change, the electronic device 200 may output feedback (e.g., sound) providing notification that the electronic device 200 is an in abnormal state (e.g., fallen) using the sound output unit 280.

According to an example embodiment, the memory 320 may store a reference value for an input for the housing 221 of the electronic device 200. The reference value may include, for example, and without limitation, at least one of the location, intensity, length, distance, time or range of an input signal for some area (e.g., surface) of the housing 221. The memory 320 may store, for example, and without limitation, at least one of a user interface (UI), a guide voice and the intensity of vibration which may be provided to the user of the electronic device 200. The memory 320 may store a program which enables one or more factors of the location, intensity, length, distance, time or range of the input signal to be combined and enables feedback to be differently output.

According to various embodiments, the memory 320 may store a program for the processing and control of the first processor 330 and the second processor 340, an operating system (OS), various applications, and input and output data, and may store a program for controlling an overall operation of the electronic device 200. The memory 320 may store various types of configuration information which are necessary when a function related to various embodiments of the disclosure is processed in the electronic device 200.

According to an example embodiment, the first processor 330 may be operatively coupled to the display 211, the distance measurement sensor 260, the sound output unit 280, the vibration output unit 290, the 6-axis sensor 310, the memory 320 and the second processor 340. The first processor 330 may control the functions and operations of the display 211, the distance measurement sensor 260, the sound output unit 280, the vibration output unit 290, the 6-axis sensor 310, the memory 320, and the second processor 340. For example, the first processor 330 may be configured to output a user interface (UI), a sound and/or vibration in response to an input signal for the housing 221, which is detected using the distance measurement sensor 260.

According to various embodiments, the first processor 330 may include various processing circuitry and perform a function for controlling an overall operation of the electronic device 200 and a flow of signals between internal elements and for processing data. The first processor 330 may include, for example, and without limitation, a central processing unit (CPU), an application processor, a communication processor, or the like. The first processor 330 may include a processor (e.g., sensor hub) which operates with lower power than an application processor. The first processor 330 may include both an application processor and a sensor hub. The first processor 330 may be configured with a single core processor or a multi-core processor, and may be configured with multiple processors.

According to an example embodiment, the second processor 340 may include various processing circuitry and control the distance measurement sensor 260. The second processor 340 may operate with lower power than the first processor 330.

According to various embodiments, if the first processor 330 is in a sleep state or standby state, the second processor 340 may monitor and process an input signal for the housing 221, which may be detected using the distance measurement sensor 260. The distance measurement sensor 260 may wait for an user input for at least some area (e.g., surface) of the housing 221 on a regular basis. When an input signal for the housing 221, which is detected using the distance measurement sensor 260, is a preset value or more, the second processor 340 may transmit a wake-up signal to the first processor 330. The first processor 330 may be enabled in response to the wake-up signal transmitted by the second processor 340. The first processor 330 may output a feedback signal, such as a user interface (UI), a sound and/or vibration, in response to the input signal for the at least some area of the housing 221. According to an example embodiment, the second processor 340 may be operatively coupled to the FPCB 250 and the distance measurement sensor 260. The second processor 340 may be configured to receive data from the distance measurement sensor 260, identify an external input for at least some area of the housing 221 based on the received data, and provide feedback corresponding to the identified external input.

According to various embodiments, the second processor 340 may be implemented separately from or as a part of the first processor 330. For example, the second processor 340 may control at least some of functions or states related to at least one (e.g., the display 211, the distance measurement sensor 260, the sound output unit 280, the vibration output unit 290 or the 6-axis sensor 310) of the elements of the electronic device 200 in place of the first processor 330 while the first processor 330 is in an inactive (e.g., sleep) state or standby state or along with the first processor 330 while the first processor 130 is in an active (e.g., enable) state.

The electronic device according to various example embodiments of the disclosure includes: the housing comprising a flexible material; the FPCB positioned within the housing; the at least one distance measurement sensor operatively coupled to the FPCB and configured to transmit a signal to at least some area of the housing at given periods and is further configured to receive a signal reflected by the some area; and the at least one processor operatively coupled to the FPCB and the at least one distance measurement sensor. The at least one processor may be configured to control the electronic device to: receive data from the at least one distance measurement sensor, identify an external input for at least some area of the housing based on the received data, and provide feedback corresponding to the identified external input.

According to an example embodiment, a plurality of the at least one distance measurement sensors may be positioned on the FPCB at given intervals to detect an external input for at least some area of the housing in all the directions (e.g., 360°) of the housing.

According to an example embodiment, the FPCB may be positioned on an external surface of the body shaft within the housing. The at least one distance measurement sensor may include the first sensor to the eighth sensor each positioned on the FPCB at an angle of 45° to detect external inputs in all the directions (e.g., 360°) of the housing.

According to an example embodiment, the number of at least one distance measurement sensors may be adjusted based on an FoV.

According to an example embodiment, the transmission signal may include at least one of light, infrared rays or ultrasonic waves.

According to an example embodiment, the at least one processor may be configured to control the electronic device to differently provide feedback based on a combination of one or more factors including the location, intensity, length, time or range of an external input.

According to an example embodiment, the flexible material may include at least one of silicon rubber or urethane sponge.

According to an example embodiment, the electronic device may further include the display operatively coupled to the at least one processor. The at least one processor may be configured to control the electronic device to display, on the display, feedback corresponding to an external input.

According to an example embodiment, the electronic device may further include the sound output unit comprising sound output circuitry operatively coupled to the at least one processor. The at least one processor may be configured to control the electronic device to output feedback corresponding to an external input using the sound output unit.

According to an example embodiment, the electronic device may further include the vibration output unit comprising vibration output circuitry operatively coupled to the at least one processor. The at least one processor may be configured to control the electronic device to output feedback corresponding to an external input using the vibration output unit.

According to an example embodiment, the at least one processor may be configured to control the electronic device to identify that an external input is received through a plurality of areas of the housing based on received data and to output feedback based on the plurality of external inputs.

According to an example embodiment, the electronic device may further include an acceleration sensor and/or a gyro sensor operatively coupled to the at least one processor. The at least one processor may be configured to control the electronic device to output feedback providing notification that the electronic device is in an abnormal state using the acceleration sensor and/or the gyro sensor based on it being determined that the electronic device is tilted at a given angle or more or an external input continues to be maintained for a given time.

According to an example embodiment, the at least one processor may further include the first processor and the second processor. The second processor may be configured to identify an external input for at least some area of the housing based on data received from the at least one distance measurement sensor.

According to an example embodiment, the first processor may be configured to be in a sleep state or standby state until a wake-up signal is received from the second processor.

According to an example embodiment, if an external surface of the housing is configured with a curve, the at least one distance measurement sensor may be positioned on the FPCB so that the direction of a transmission signal is tilted toward the top or bottom of the housing.

Figure 4:
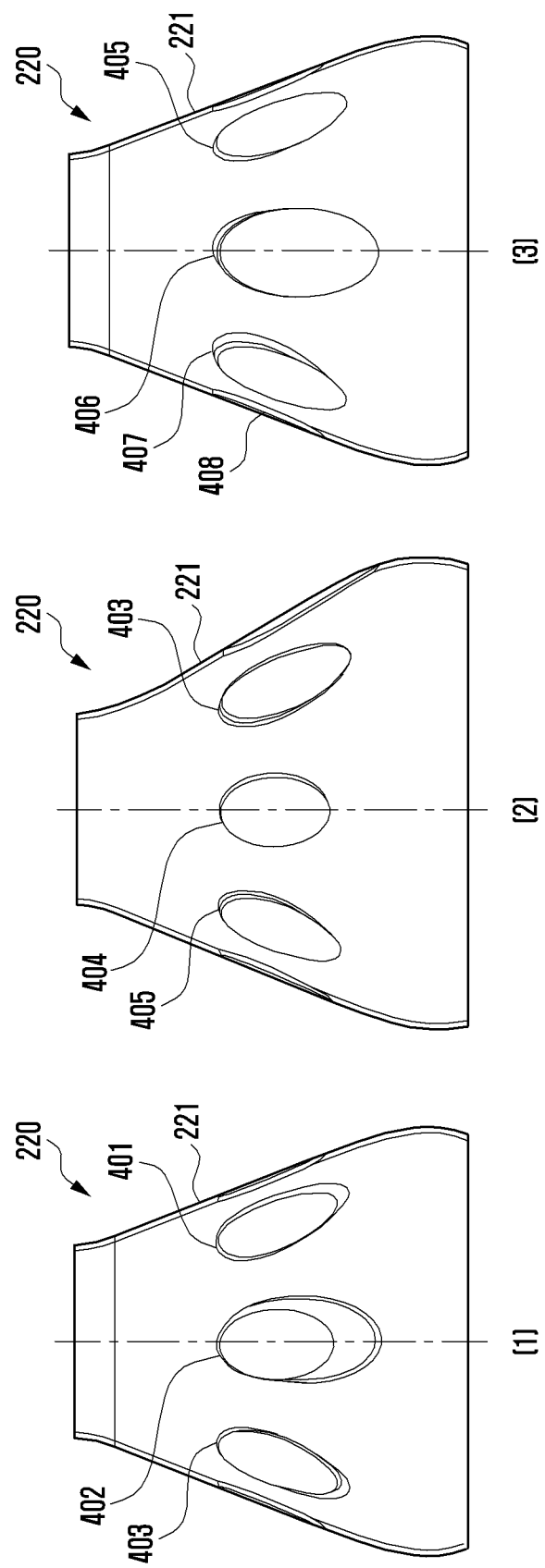
FIG. 4 is a diagram illustrating an example of an area of a housing covered by the distance measurement sensor of the electronic device according to various embodiments of the disclosure.

FIG. 4 is a diagram illustrating an example of an area of a housing, which is covered by the distance measurement sensor of the electronic device according to various embodiments of the disclosure.

In FIG. 4, 1 may illustrate the front of the body unit 220 of the electronic device 200. In FIG. 4, 2 may illustrate the side of the body unit 220 of the electronic device 200. In FIG. 4, 3 may illustrate the back of the body unit 220 of the electronic device 200.

Referring to FIG. 4, the housing 221 may include areas 401, 402, 403, 404, 405, 406, 407 and 408 (which may be referred to hereinafter as a first area 401 to eighth area 408) corresponding to the first sensor 301 to the eighth sensor 308.

According to an example embodiment, the first area 401 to the eighth area 408 may be spaced apart from each other at given distances. The housing 221 may include a flexible material. Accordingly, when a user presses at least one area (e.g., surface) of the first area 401 to the eighth area 408, the left and right parts of each area may also be pressed. In this case, although only the first area 401 to the eighth area 408 corresponding to the first sensor 301 to the eighth sensor 308 are formed, the distance measurement sensor 260 may detect a signal received through the entire surface of the housing 221. According to an example embodiment, the first area 401 to the eighth area 408 corresponding to the first sensor 301 to the eighth sensor 308 may be spaced apart from each other at predetermined intervals (e.g., about 45°) so that they can cover signals received through the housing 221 in all the directions (e.g., 360°) (e.g., front, back, left and right).

Figure 5:
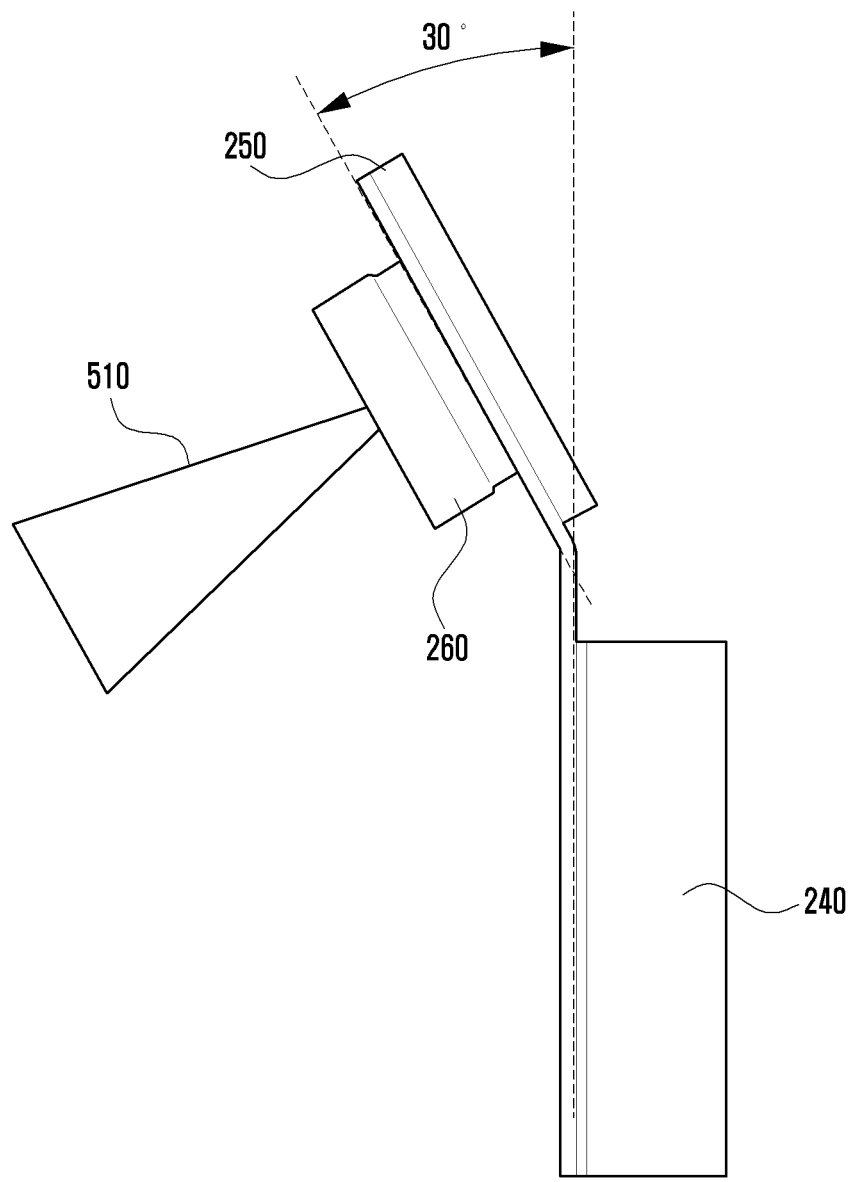
FIG. 5 is a diagram illustrating an example of a radiation direction of the distance measurement sensor of the electronic device according to various embodiments of the disclosure.

FIG. 5 is a diagram illustrating an example of the radiation direction of the distance measurement sensor of the electronic device according to various embodiments of the disclosure.

According to an example embodiment, the housing 221 of the electronic device 200 according to various embodiments of the disclosure may include a flexible material and may be configured with a curve. In this case, the distance measurement sensor 260 may be mounted on the FPCB 250 so that the radiation direction of the light-emitting unit 261 and the incident direction 510 of the light-receiving unit 263 are tilted upward or downward.

According to an example embodiment, if the housing 221 of the electronic device 200 is configured with a curve, at least some of the first sensor 301 to the eighth sensor 308 corresponding to the distance measurement sensor 260 may be mounted on the FPCB 250 so that the radiation direction of the light-emitting unit 261 and the incident direction 510 of the light-receiving unit 263 are tilted downward or upward. The radiation direction and the incident direction 510 may include an FoV which may be covered by the distance measurement sensor 260.

According to various embodiments, the distance measurement sensor 260 may be positioned on the FPCB 250 so that the radiation direction of the light-emitting unit 261 and the incident direction 510 of the light-receiving unit 263 are tilted at a given angle (e.g., about 30°) to the longitudinal axial line of the body shaft 240. In the embodiment of FIG. 5, the radiation direction of the light-emitting unit 261 and the incident direction 510 of the light-receiving unit 263 have been illustrated as being tilted downward and the distance measurement sensor 260 has been illustrated as detecting an input signal for the housing 221. For example, the radiation direction of the light-emitting unit 261 and the incident direction 510 of the light-receiving unit 263 may be illustrated as being tilted upward, and the distance measurement sensor 260 may detect an input signal for the housing 221.

Figure 6:
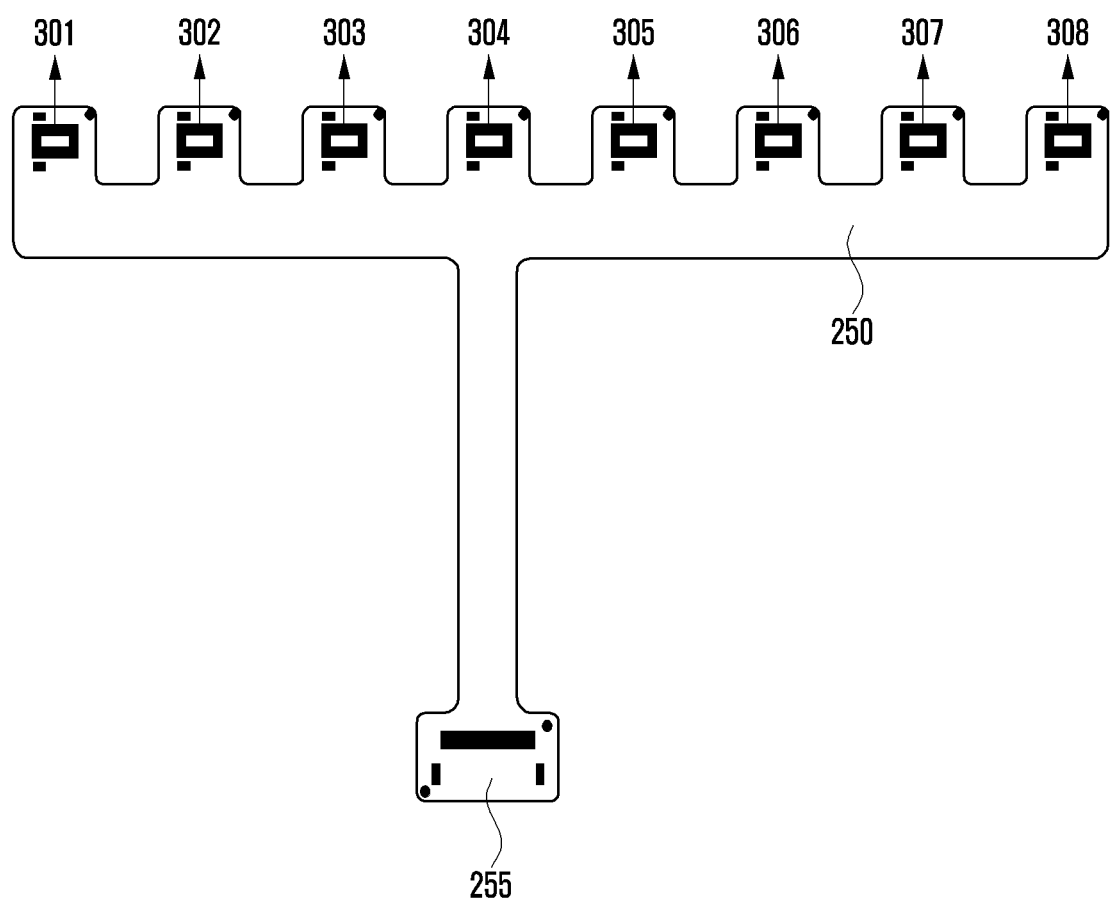
FIG. 6 is a diagram illustrating an example distance measurement sensor of the electronic device according to various embodiments of the disclosure.

FIG. 6 is a diagram illustrating an example distance measurement sensor of the electronic device according to various embodiments of the disclosure.

Referring to FIG. 6, the first sensor 301 to the eighth sensor 308 may be spaced apart from each other at given intervals and positioned on the FPCB 250 so that FoVs do not overlap (e.g., when the FPCB is wrapped around the body shaft 240). The connector 255 may be positioned at one end of the FPCB 250. The connector 255 may be electrically connected to the PCB 270 illustrated in FIG. 2.

Figure 7:
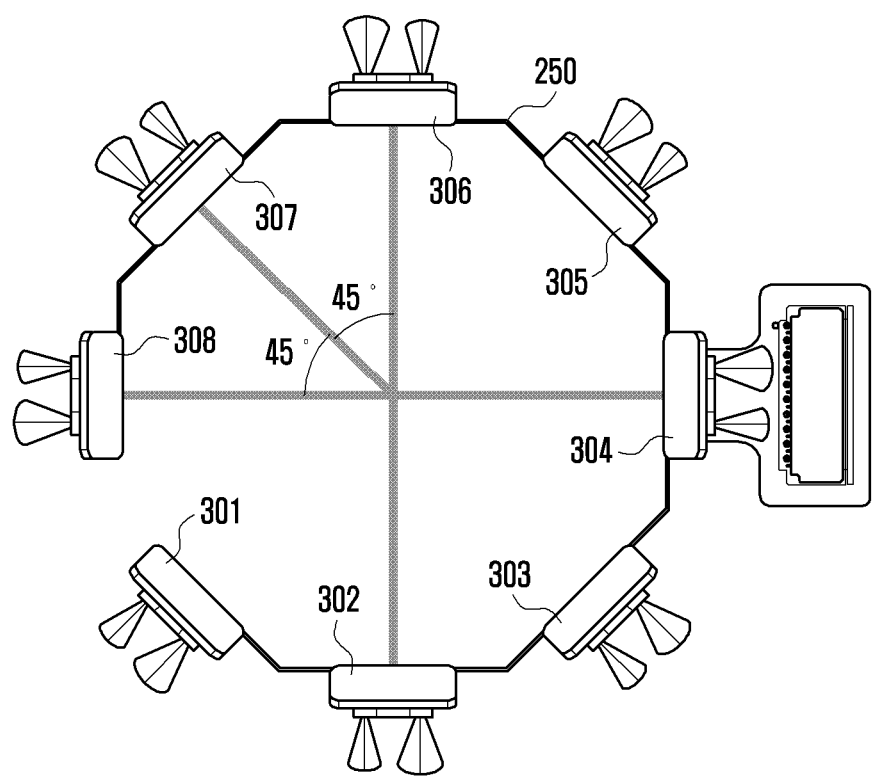
FIG. 7 is a diagram illustrating an example of the deployment of the distance measurement sensors of the electronic device according to various embodiments of the disclosure.

FIG. 7 is a diagram illustrating an example of the deployment of the distance measurement sensors of the electronic device according to various embodiments of the disclosure.

Referring to FIG. 7, the first sensor 301 to the eighth sensor 308 may be spaced apart from each other at a predetermined interval (e.g., about 45°) for each sensor and disposed on the FPCB 250 so that they can cover a signal received through some area (e.g., surface) of the housing 221 in all the directions (e.g., 360°) (e.g., front, back, left and right). For example, an angle at which the sixth sensor 306 and the seventh sensor 307 are installed may be about 45°, and an angle at which the seventh sensor 307 and the eighth sensor 308 may be about 45°.

According to various embodiments, the number of sensors included in the distance measurement sensor 260 of the electronic device 200 and the location of each sensor may be determined based on the direction (e.g., front direction) and range of an FoV which may be covered by each sensor. For example, if an FoV which may be covered by the distance measurement sensor 260 is about 45°, the electronic device 200 may include the first sensor 301 to the eighth sensor 308, and the interval in which the first sensor 301 to the eighth sensor 308 are disposed may be set to about 45°.

Figure 8A:
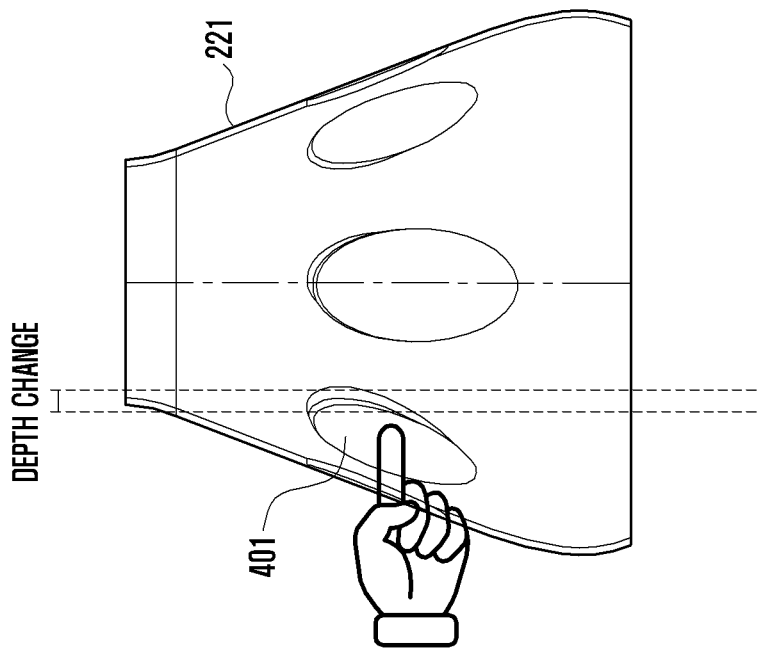
FIGS. 8A, 8B and 8C are diagrams illustrating an example of feedback based on a depth change for an input for some area of the housing of the electronic device according to various embodiments of the disclosure.
Figure 8B:
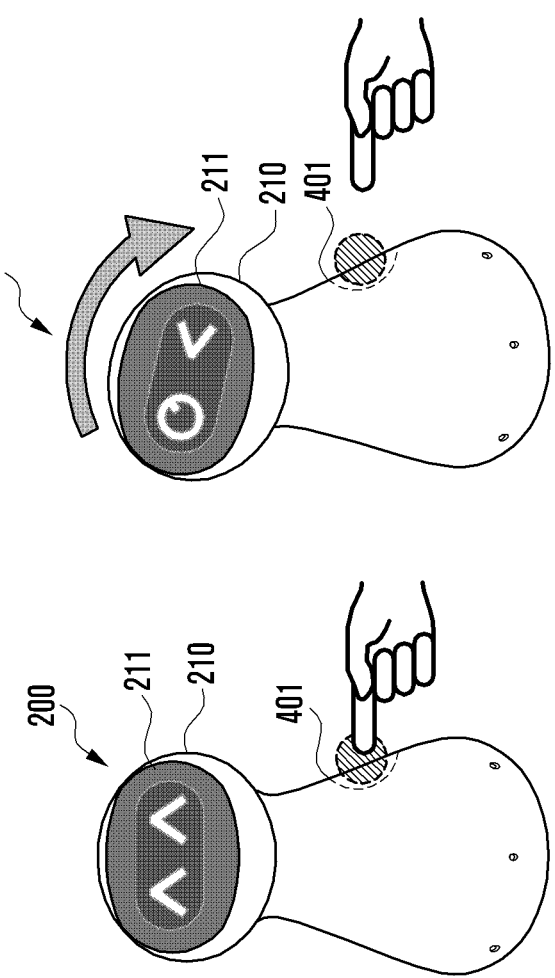
Figure 8C:
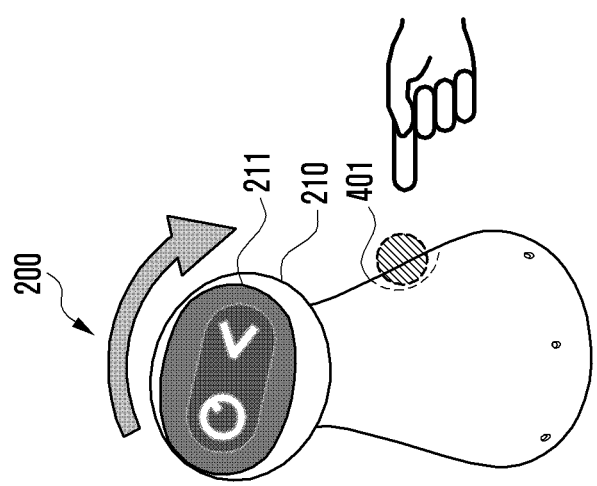

FIGS. 8A, 8B and 8C are diagrams illustrating an example of feedback based on a depth change for an input for some area of the housing of the electronic device according to various embodiments of the disclosure.

Referring to FIG. 8A, a depth change of the housing 221 may be changed based on a user's touch and pressing of the electronic device 200. For example, a depth change of the housing 221 may be changed by about 10 mm to 30 mm in response to a touch and pressing pressure applied to the first area 401. According to various embodiments, the electronic device 200 may include the at least one distance measurement sensor 260 within the housing 221. The distance measurement sensor 260 may transmit a given signal (e.g., light, infrared rays or an ultrasonic signal) to at least some area of the housing 221 at given periods using the light-emitting unit 261. When an input occurs in at least some area of the housing 221, the distance measurement sensor 260 may detect a given signal reflected and returned from at least some area of the housing 221 in which the input has occurred through the light-receiving unit 263. According to an example embodiment, when an input (e.g., pressing) occurs in the first area 401 of the housing 221 by a user, the first sensor 301 may detect a depth change (e.g., pressing intensity) by detecting a signal reflected and returned due to the deformation of the first area 401. For example, if an input (e.g., pressing) for the first area 401 of the housing 221 is about 10 mm or about 15 mm, the first sensor 301 may identify that a depth change for the input of about 15 mm is greater than a depth change for the input of about 10 mm.

Referring to FIG. 8B, when a depth change for an input (e.g., pressing) for the first area 401 of the housing 221 is about 10 mm to 15 mm, the electronic device 200 may provide positive feedback. For example, when a depth change for an input (e.g., pressing) for the first area 401 of the housing 221 is about 10 mm to 15 mm, the distance measurement sensor 260 may detect a detection signal for the first area 401 in which the pressing has occurred through the first sensor 301. The detected signal may be transmitted to the first processor 330 through the second processor 340. The first processor 330 may display positive feedback, such as a smiling expression (e.g., ∧ ∧), on the display 211 of the head unit 210 based on the detection signal for the first area 401. The first processor 330 may output a sound related to the positive feedback through the sound output unit 280. The first processor 330 may output vibration related to the positive feedback through the vibration output unit 290.

Referring to FIG. 8C, when a depth change for an input (e.g., pressing) for the first area 401 of the housing 221 is about 20 mm to 25 mm, the electronic device 200 may provide negative feedback. For example, when a depth change for an input (e.g., pressing) for the first area 401 of the housing 221 is about 20 mm to 25 mm, the first sensor 301 corresponding to the first area 401 may detect an input signal for the first area 401 in which the pressing has occurred. The detected signal may be transmitted to the first processor 330 through the second processor 340. The first processor 330 may move the head unit 210 in a given direction based on the detection signal for the first area 401 so that the head unit 210 creates a tilting scene. The first processor 330 may display, on the display 211 of the head unit 210, negative feedback such as a surprised expression (e.g., O<). The first processor 330 may output a sound related to the negative feedback through the sound output unit 280. The first processor 330 may output vibration related to the negative feedback through the vibration output unit 290.

Figure 9:
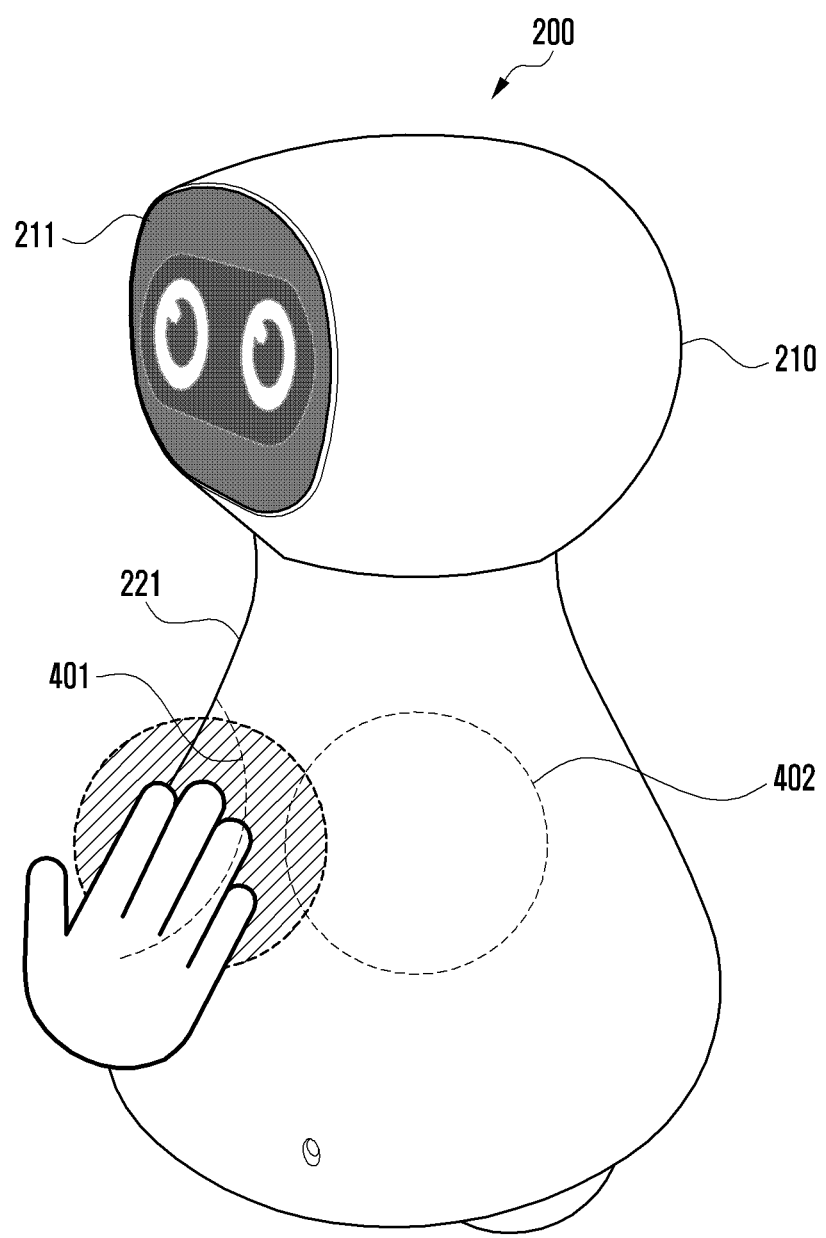
FIG. 9 is a diagram illustrating an example of feedback corresponding to an input for at least some area of the housing of the electronic device according to various embodiments of the disclosure.

FIG. 9 is a diagram illustrating an example of feedback corresponding to an input for at least some area of the housing of the electronic device according to various embodiments of the disclosure.

Referring to FIG. 9, the electronic device 200 may provide feedback corresponding to a user's repetitive input (e.g., a touch and press) for the housing 221.

According to an example embodiment, when a repetitive input (e.g., tap) having a depth change of about 5 mm to 7 mm for the first area 401 of the housing 221 occurs, the first sensor 301 corresponds to the first area 401 may detect an input signal for the first area 401 in which the tap has occurred. The detected signal may be transmitted to the first processor 330 through the second processor 340. The first processor 330 may display feedback, such as (O O), on the display 211 of the head unit 210 based on the detection signal for the first area 401. The first processor 330 may output a sound related to the feedback through the sound output unit 280. The first processor 330 may output vibration related to the feedback through the vibration output unit 290.

According to an example embodiment, when a user's input (e.g., a touch and press) occurs near a place between the first area 401 and second area 402 of the housing 221, the electronic device 200 may detect a depth change for the first area 401 and the second area 402. The electronic device 200 may detect an input signal for the first area 401 and the second area 402 in which the user's input has occurred using the first sensor 301 and the second sensor 302. The detected signal may be transmitted to the first processor 330 through the second processor 340. The first processor 330 may provide feedback, such as various displays, sounds and/or vibration, based on the detection signal for the first area 401 and the second area 402.

Figure 10:
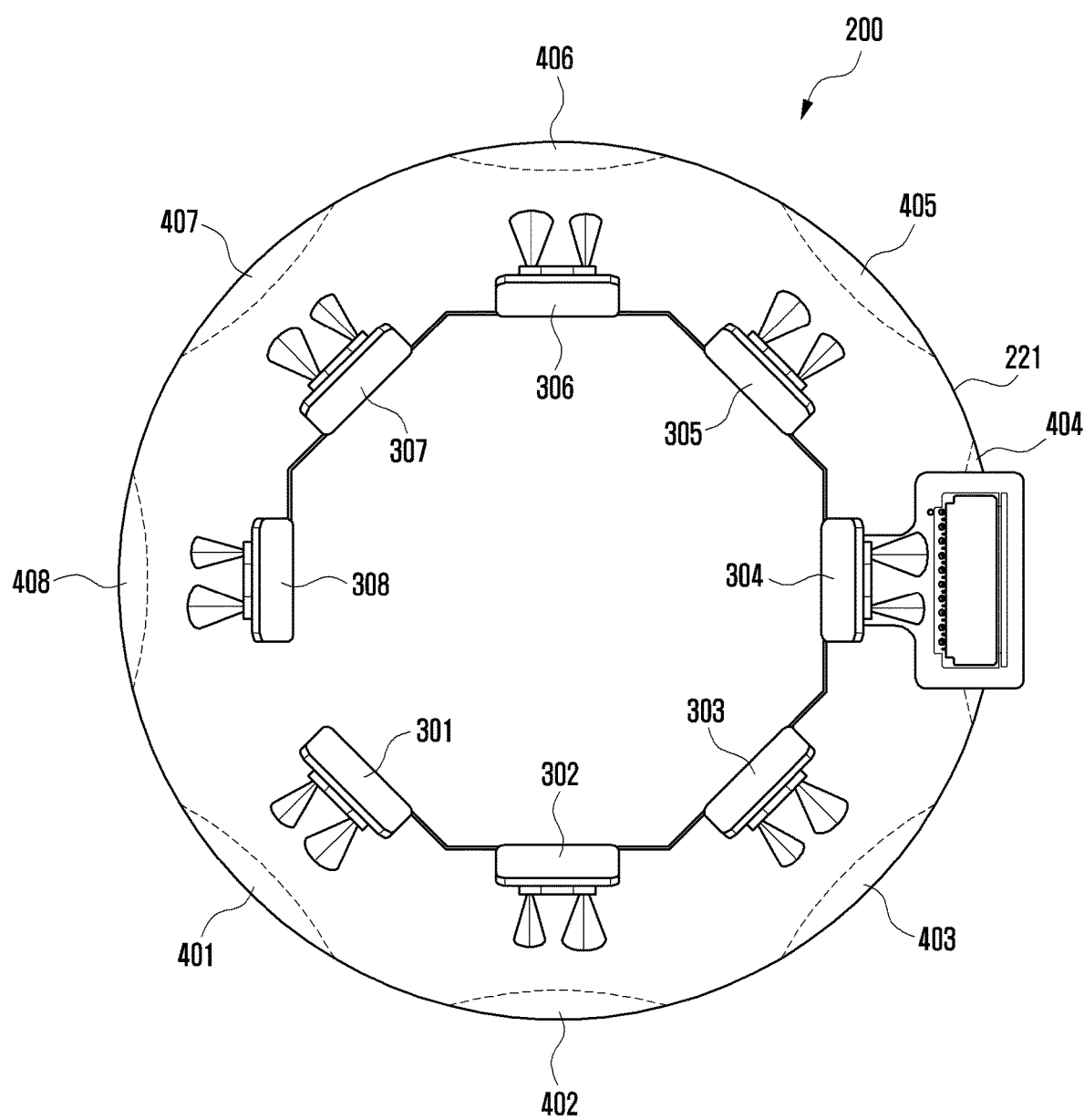
FIG. 10 is a diagram illustrating an example of feedback corresponding to a signal detected by a plurality of distance measurement sensors of the electronic device according to various embodiments of the disclosure.

FIG. 10 is a diagram illustrating an example of feedback corresponding to a signal detected by a plurality of distance measurement sensors of the electronic device according to various embodiments of the disclosure.

Referring to FIG. 10, a user may perform a plurality of inputs (e.g., a hug behavior or a two-hand pressing behavior) on the housing 221 of the electronic device 200. A plurality of sensors of the first sensor 301 to eighth sensor 308 of the electronic device 200 may detect an input signal (e.g., depth change) for at least some area (e.g., the first area 401 to the eighth area 408) of the housing 221.

According to an example embodiment, when a user of the electronic device 200 performs a plurality of inputs (e.g., a hug behavior) on the housing 221, a depth change of about 5 mm or more for the housing 221 may be maintained for about 1 second to about 5 seconds in a plurality of areas (e.g., at least two or more areas of the first area 401 to the eighth area 408). For example, when a user of the electronic device 200 performs a plurality of inputs (e.g., a hug behavior) on the housing 221, a depth change may occur in at least two or more areas between the first area 401 to fifth area 405 of the housing 221, at least two or more areas between the second area 402 to sixth area 406 of the housing 221, at least two or more areas between the third area 403 to seventh area 407 of the housing 221, and at least two or more areas between the fourth area 304 to eighth area 408 of the housing 221. The first sensor 301 to the fifth sensor 305, the second sensor 302 to the sixth sensor 306, the third sensor 303 to the seventh sensor 307, and the fourth sensor 304 to the eighth sensor 308 may detect respective input signals based on depth changes of the respective areas of the housing 221.

According to an example embodiment, when a user of the electronic device 200 performs a plurality of inputs (e.g., a hug behavior) on the housing 221, depth changes may occur in all of the first area 401 to the eighth area 408. The first sensor 301 to the eighth sensor 308 may detect input signals based on depth changes of the first area 401 to eighth area 408 of the housing 221.

According to an example embodiment, when a user of the electronic device 200 performs a plurality of inputs (e.g., a hug behavior) on the housing 221, the electronic device 200 may detect depth changes in all of the first area 401 to the eighth area 408 through the first sensor 301 to the eighth sensor 308, and may identify the location of the user based on the depth changes. For example, when a user hugs the electronic device 200 at the back of the electronic device 200, the electronic device 200 may rotate the head unit 210 backward.

Figure 11:
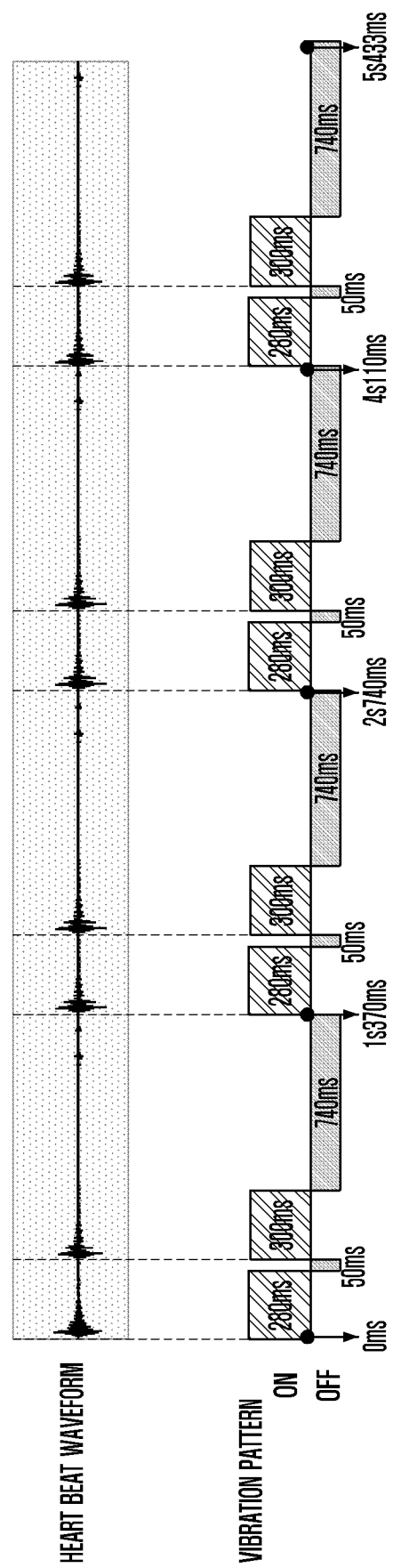
FIG. 11 is a diagram illustrating an example of feedback corresponding to a user input that modifies the housing of the electronic device according to various embodiments of the disclosure.

FIG. 11 is a diagram illustrating an example of feedback corresponding to a user input that modifies the housing of the electronic device according to various embodiments of the disclosure.

According to an example embodiment, when a plurality of inputs (e.g., a hug behavior) is performed on the housing 221, the electronic device 200 may output feedback (e.g., vibration or a sound pattern) similar to the heart beat of a user.

According to an example embodiment, if a depth change occurs because a user of the electronic device 200 performs an input (e.g., hug behavior) on at least some area (e.g., the first area 401 to the eighth area 408) of the housing 221, at least some sensor (e.g., the first sensor 301 to the eighth sensor 308) may detect an input signal for the area where the depth change has occurred. The detected signal may be transmitted to the first processor 330 through the second processor 340. The first processor 330 may provide the same feedback (e.g., vibration pattern) as a heartbeat waveform, for example, using the vibration output unit 290 based on the detected signal.

Referring to FIG. 11, when a plurality of inputs (e.g., a hug behavior) is performed on the housing 221, the first processor 330 may output a vibration pattern, such as 0 ms (Off)→280 ms (On)→50 ms (Off)→300 ms (On)→740 ms (Off), using the vibration output unit 290. For example, the first processor 330 may repeatedly output vibration by a given number of times (e.g., 4 times), for example, based on a user's heart beat waveform.

Figure 12:
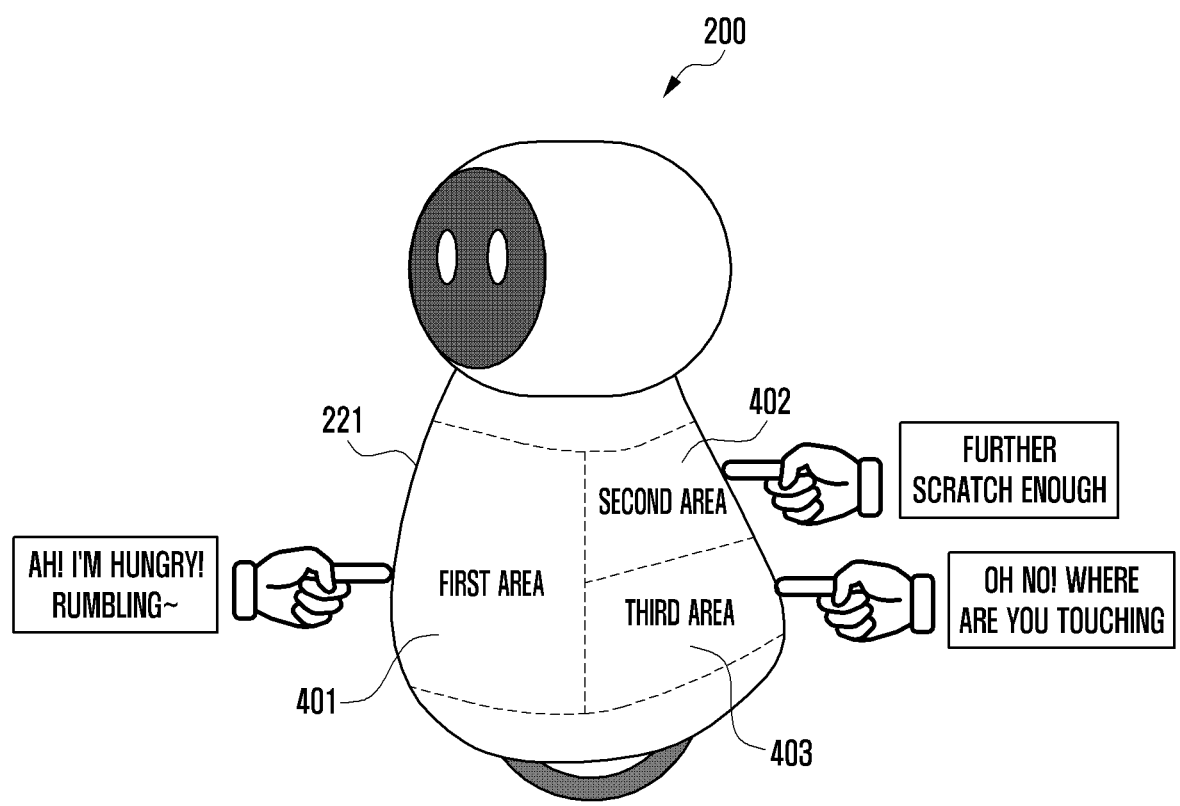
FIG. 12 is a diagram illustrating an example in which different feedback is provided based on an area configured in the housing of the electronic device according to various embodiments of the disclosure.

FIG. 12 is a diagram illustrating an example in which different feedback is provided based on an area configured in the housing of the electronic device according to various embodiments of the disclosure.

According to an example embodiment, when a user of the electronic device 200 presses the first area 401 of the housing 221, the first processor 330 may output a sound, such as, "Ah! I'm hungry! Rumbling~", using the sound output unit 280.

According to an example embodiment, when a user of the electronic device 200 presses the second area 402 of the housing 221, the first processor 330 may output a sound, such as "Further scratch enough", using the sound output unit 280.

According to an example embodiment, when a user of the electronic device 200 presses the third area 403 of the housing 221, the first processor 330 may output a sound, such as "Oh no! Where are you touching", using the sound output unit 280.

According to various embodiments, a surface of the housing 221 of the electronic device 200 may include a flexible material. A signal input to some area (e.g., the first area 401 to the eighth area 408) of the housing 221 may be detected using a distance measurement sensor (e.g., the first sensor 301 to the eighth sensor 308) and transmitted to the processor 340. Accordingly, a user can be provided with various types of feedback (e.g., a display, a sound and/or vibration).

According to various embodiments of the disclosure, the electronic device can provide various types of feedback based on a user input by configuring a surface of the housing using a flexible material and detecting a signal input to the outside of the housing using the distance measurement sensor.

While the disclosure has been illustrated and described with reference to various example embodiments thereof, it will be understood by those skilled in the art that various changes in form and details may be made therein without departing from the scope of the subject matter, including the appended claims.

What is claimed is:

1. An electronic device comprising:
a housing comprising a flexible material;
a flexible printed circuit board (FPCB) positioned within the housing;
at least one distance measurement sensor disposed on the FPCB and spaced from an inner surface of the housing and configured to obtain data on a distance from the inner surface of the housing to the at least one distance measurement sensor; and
at least one processor operatively coupled to the FPCB and the at least one distance measurement sensor,
wherein the at least one processor is configured to control the electronic device to:
receive, when an external input is inputted on an external surface of the housing, data on a distance from the inner surface of the housing obtained by the at least one distance measurement sensor;
identify the external input on the external surface of the housing based on the received data; and
generate feedback corresponding to the identified external input.

2. The electronic device of claim 1, wherein the electronic device comprises a plurality of distance measurement sensors disposed on the FPCB spaced from each other at specified intervals, and the plurality of distance measurement sensors are configured to obtain data on distance from the inner surface of the housing for identifying external input on the external surface of the housing in a 360° direction(s) of the housing.

3. The electronic device of claim 2, wherein:
the FPCB is positioned on an external surface of a body shaft provided within the housing, and
the plurality of distance measurement sensors comprises eight sensors positioned on the FPCB at the specified intervals wherein the FPCB, when disposed on a body shaft of the electronic device, provide each of the eight sensors at an angle of 45° so that the distance measurement sensors obtain data regarding the distance from the inner surface of the housing for identifying the external input in the 360° direction(s) of the housing.

4. The electronic device of claim 1, wherein a total number of the distance measurement sensors is adjusted based on a field of view (FoV) of each sensor.

5. The electronic device of claim 1, wherein the at least one processor is configured to control the electronic device to differently generate the feedback based on a combination of one or more of a location, intensity, length, time or range of the external input.

6. The electronic device of claim 1, wherein the flexible material comprises at least one of silicon rubber or urethane sponge.

7. The electronic device of claim 1, further comprising a display operatively coupled to the at least one processor,
wherein the at least one processor is configured to control the electronic device to display, on the display, the feedback corresponding to the identified external input.

8. The electronic device of claim 1, further comprising a sound output unit comprising sound output circuitry operatively coupled to the at least one processor,
wherein the at least one processor is configured to control the electronic device to output the feedback corresponding to the identified external input using the sound output unit.

9. The electronic device of claim 1, further comprising a vibration output unit comprising vibration output circuitry operatively coupled to the at least one processor,
wherein the at least one processor is configured to control the electronic device to output the feedback corresponding to the identified external input using the vibration output unit.

10. The electronic device of claim 1, wherein the at least one processor is configured to control the electronic device to:
identify a plurality of external inputs received simultaneously through a plurality of areas of the housing based on the received data, and
output feedback corresponding to the plurality of external inputs.

11. The electronic device of claim 1, further comprising an acceleration sensor and/or a gyro sensor operatively coupled to the at least one processor,
wherein the at least one processor is configured to control the electronic device to: output feedback providing notification that the electronic device is in an abnormal state using the acceleration sensor and/or the gyro sensor based on the electronic device being tilted at a given angle or more or based on the identified external input being continuously maintained for a given time.

12. The electronic device of claim 1, wherein:
the at least one processor comprises a first processor and a second processor, and the second processor is configured to identify the external input on the external surface of the housing based on the received data received from the at least one distance measurement sensor.

13. The electronic device of claim 12, wherein the first processor is configured to be in a sleep state or a standby state until the first processor receives a wake-up signal from the second processor.

14. The electronic device of claim 2, wherein based on the external surface of the housing being configured to have a curve shape, the at least one distance measurement sensor is positioned on the FPCB so that a direction of the transmitted signal is tilted toward a top or a bottom of the housing.

15. An electronic device comprising:
a head unit comprising a head of the electronic device, wherein a display is positioned in at least some portion of the head unit;
a body unit comprising a body of the electronic device and comprising a housing including a flexible material, a body shaft operatively coupled to the head unit, and a printed circuit board (PCB); and
a driving unit comprising driving circuitry operatively coupled to the body unit, and configured to provide movement of the electronic device,
wherein the body unit comprises:
a flexible printed circuit board (FPCB) positioned on an external surface of the body shaft,
a distance measurement sensor operatively coupled to the FPCB, and configured to transmit a signal to at least some area of the housing at given periods and configured to detect a signal reflected and received from the at least some area where an external input occurs based on the external input occurring in the at least some area, and
at least one processor configured to control the electronic device to provide feedback corresponding to the external input transmitted through the distance measurement sensor.

16. The electronic device of claim 15, wherein:
the distance measurement sensor comprises a plurality of distance measurement sensors disposed on the FPCB at given intervals wherein the distance measurement sensors detect the external input received through at least some area of the housing, and a number of the distance measurement sensors is adjusted based on a field of view (FoV) of each sensor.

17. The electronic device of claim 15, wherein based on an external surface of the housing being configured with a curve, the distance measurement sensor is positioned on the FPCB so that a transmission direction of the signal is tilted toward a top or a bottom of the housing.

18. The electronic device of claim 15, further comprising a 6-axis sensor operatively coupled to the at least one processor,
wherein the at least one processor is configured to control the electronic device to output feedback providing a notification that the electronic device is in an abnormal state using the 6-axis sensor based on the electronic device being tilted at a given angle or more or the external input being continuously maintained for a given time.

19. The electronic device of claim 15, further comprising a sound output unit comprising sound output circuitry or a vibration output unit comprising vibration output circuitry, each configured to provide the feedback corresponding to the external input detected using the distance measurement sensor.

20. The electronic device of claim 1, wherein the at least distance measurement sensor is configured to obtain the data on the distance from the inner surface of the housing based on a signal transmitted from the at least one distance measurement sensor to the inner surface of the housing and a signal reflected from the inner surface of the housing to the at least one distance measurement sensor.

21. The electronic device of claim 1, wherein the at least distance measurement sensor is configured to obtain the data on the distance from the inner surface of the housing based on a signal reflected from a portion of the inner surface of the housing deformed by the external input.

22. The electronic device of claim 1, wherein the at least distance measurement sensor includes a light emitter transmitting a signal to the inner surface of the housing at given periods and a light receiver receiving a signal reflected from the inner surface of the housing.

23. The electronic device of claim 20, wherein the transmitted signal comprises at least one of light, infrared rays or ultrasonic waves.

* * * * *